United States Patent
Liu et al.

(10) Patent No.: US 8,831,167 B2
(45) Date of Patent: Sep. 9, 2014

(54) SHIFT REGISTER AND GATE DRIVING CIRCUIT THEREOF

(71) Applicant: AU Optronics Corp., Hsin-Chu (TW)

(72) Inventors: Li-Wei Liu, Hsin-Chu (TW); Tsung-Ting Tsai, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/778,063

(22) Filed: Feb. 26, 2013

(65) Prior Publication Data

US 2014/0118052 A1 May 1, 2014

(30) Foreign Application Priority Data

Nov. 1, 2012 (TW) .................................. 101140494

(51) Int. Cl.
*G11C 19/00* (2006.01)

(52) U.S. Cl.
USPC .................................. 377/64; 377/78; 377/79

(58) Field of Classification Search
None
See application file for complete search history.

(56) References Cited

U.S. PATENT DOCUMENTS

| | | | |
|---|---|---|---|
| 7,612,754 B2 | 11/2009 | Kuo | |
| 7,907,696 B2 * | 3/2011 | Chen et al. | 377/64 |
| 8,031,160 B2 * | 10/2011 | Chen et al. | 345/100 |
| 8,284,890 B2 * | 10/2012 | Chiang | 377/64 |
| 8,289,262 B2 | 10/2012 | Tsai | |
| 8,643,584 B2 * | 2/2014 | Han et al. | 345/100 |
| 2006/0291610 A1 * | 12/2006 | Lo et al. | 377/64 |
| 2008/0048964 A1 * | 2/2008 | Chang et al. | 345/98 |
| 2008/0219401 A1 * | 9/2008 | Tobita | 377/79 |
| 2009/0058790 A1 * | 3/2009 | Chiang et al. | 345/100 |
| 2011/0007049 A1 | 1/2011 | Kikuchi | |
| 2011/0150169 A1 * | 6/2011 | Lin et al. | 377/64 |
| 2011/0274234 A1 * | 11/2011 | Sakamoto et al. | 377/64 |
| 2012/0044132 A1 * | 2/2012 | Koga et al. | 345/100 |
| 2012/0105397 A1 * | 5/2012 | Tan et al. | 345/205 |

FOREIGN PATENT DOCUMENTS

| | | |
|---|---|---|
| TW | 200631032 | 9/2006 |
| TW | 201102733 | 1/2011 |

* cited by examiner

*Primary Examiner* — Tuan T Lam
(74) *Attorney, Agent, or Firm* — Winston Hsu; Scott Margo

(57) ABSTRACT

An Nth shift register includes a pull up unit, a driving unit, a first pull down unit, a second pull down unit, and a third pull down unit. The pull up unit is used for providing a first pull up signal according to a first clock signal, a second clock signal, and a starting pulse. The driving unit is used for providing a driving signal according to the first pull up signal and providing a gate signal according to the first clock signal and the driving signal. The first pull down unit is used for pulling down the first pull up signal according to the first clock signal. The second pull down unit is used for pulling down the driving signal according to a second pull up signal. The third pull down unit is used for pulling down the gate signal according to the second clock signal.

17 Claims, 9 Drawing Sheets

SHIFT REGISTER AND GATE DRIVING CIRCUIT THEREOF

BACKGROUND OF THE INVENTION

1. Field of the Invention

The present invention is related to a shift register, and more particularly, to a shift register of gate driving circuit.

2. Description of the Prior Art

FIG. 1 is a diagram illustrating a prior art display panel 100. The display panel 100 includes a gate driving circuit 102 and a pixel array 112. The gate driving circuit 102 includes a plurality of shift registers. Each stage of shift register outputs a gate signal to the pixel array 112 in sequence through scanning lines 110 respectively.

FIG. 2 is a timing diagram illustrating the gate driving circuit 102 of FIG. 1. For brevity, an (N−1) th shift register 104, an Nth shift register 106, and an (N+1)th shift register 108 of FIG. 1 are taken as example in FIG. 2. In FIG. 2, the horizontal axis is time t, the vertical axis is voltage, and from top to bottom are a second clock signal XCK, a first clock signal CK, a gate signal Gn−1 outputted from the (N−1) th shift register 104, a gate signal Gn outputted from the Nth shift register 106, and a gate signal Gn+1 outputted from the (N+1) th shift register 108. During the T1 period, the second clock signal XCK switches from a low voltage to a high voltage and the (N−1) th shift register 104 outputs the high voltage to be the gate signal Gn−1 according to the second clock signal XCK. During the T2 period, the first clock signal CK switches from the low voltage to the high voltage and the Nth shift register 106 outputs the high voltage to be the gate signal Gn according to the first clock signal CK. During the T3 period, the second clock signal XCK again switches from the low voltage to the high voltage and the (N+1)th shift register 108 outputs the high voltage to be the gate signal Gn+1 according to the second clock signal XCK. Therefore, circuit nodes of the shift registers next to each other in the gate driving circuit 102 for receiving the second clock signal XCK and the first clock signal CK are arranged in alternating order to output gate signals respectively. Further the gate signal Gn+1 outputted from the (N+1) th shift register is outputted immediately after the gate signal Gn outputted from the Nth shift register, namely, the gate signal Gn+1's waveform is the gate signal Gn's waveform being shifted once.

However, for the gate signal Gn and the gate signal Gn+1 to be separated from each other by a half period of the first clock signal CK, namely, for the gate signal Gn+1's waveform to be the gate signal Gn's waveform shifted twice, components and wires of the Nth shift register 106 must be duplicated in layout. Further, in order for the gate signal of each stage of shift register to be separated from a preceding stage next to the stage of shift register by a half period of the first clock signal CK, each stage of shift register must be laid out twice, thereby increasing components number and layout area required by the gate driving circuit 102, which makes it harder to shrink display panel size.

SUMMARY OF THE INVENTION

An embodiment of the invention discloses a gate driving circuit. The gate driving circuit includes an Nth shift register and an (N+1) th shift register. The Nth shift register includes a pull up unit, a driving unit, a first pull down unit, a second pull down unit, and a third pull down unit. The (N+1)th shift register includes a pull up unit, a driving unit, a first pull down unit, a second pull down unit, and a third pull down unit.

Another embodiment of the invention discloses an Nth shift register. The Nth shift register includes a pull up unit, a driving unit, a first pull down unit, a second pull down unit, and a third pull down unit. The pull up unit is used for providing a first pull up signal according to a first clock signal, a second clock signal, and a starting pulse. The driving unit is used for providing a driving signal according to the first pull up signal and providing a gate signal according to the first clock signal and the driving signal. The first pull down unit is used for pulling down the first pull up signal according to the first clock signal. The second pull down unit is used for pulling down the driving signal according to a second pull up signal. The third pull down unit is used for pulling down the gate signal according to the second clock signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
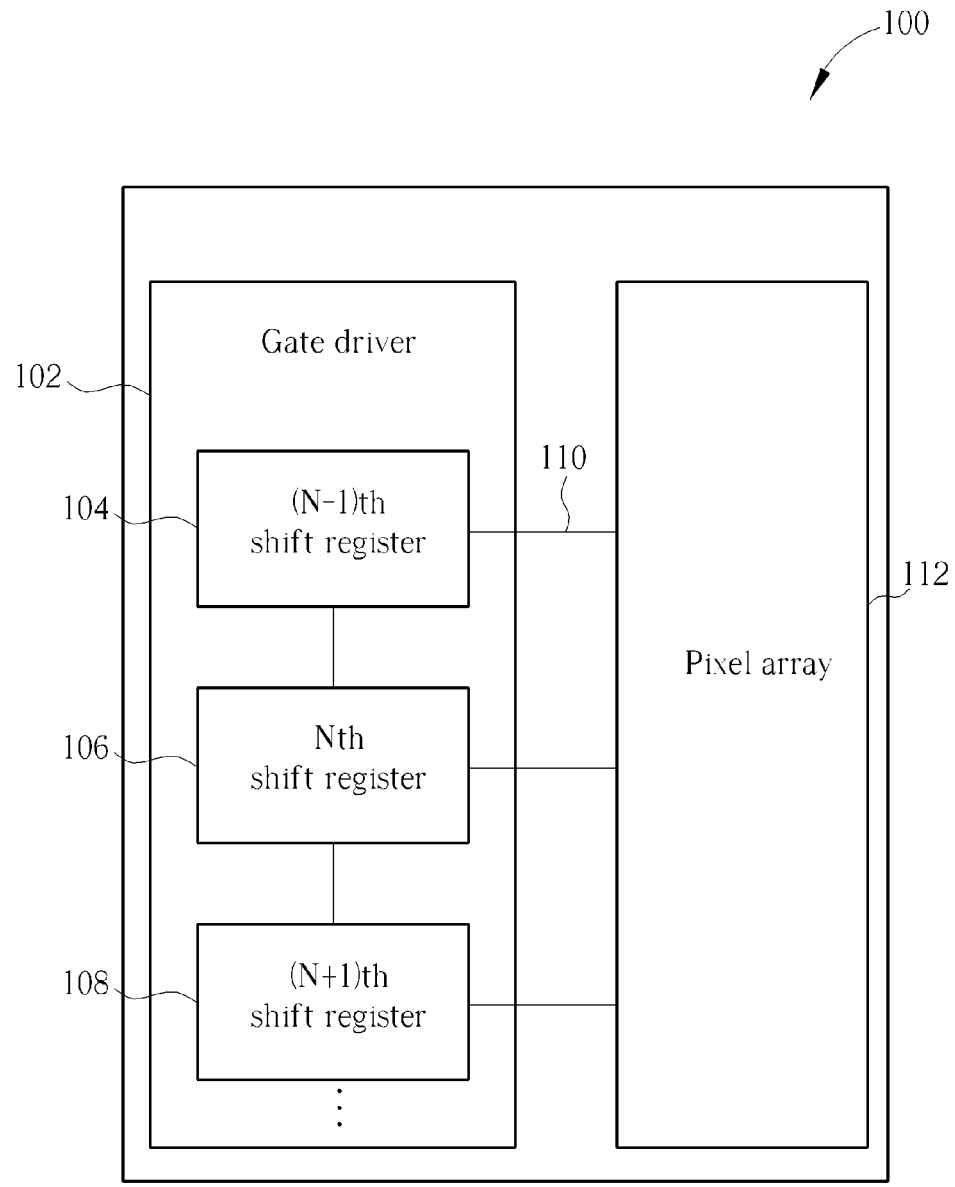
FIG. 1 is a diagram illustrating a prior art display panel.
Figure 2:
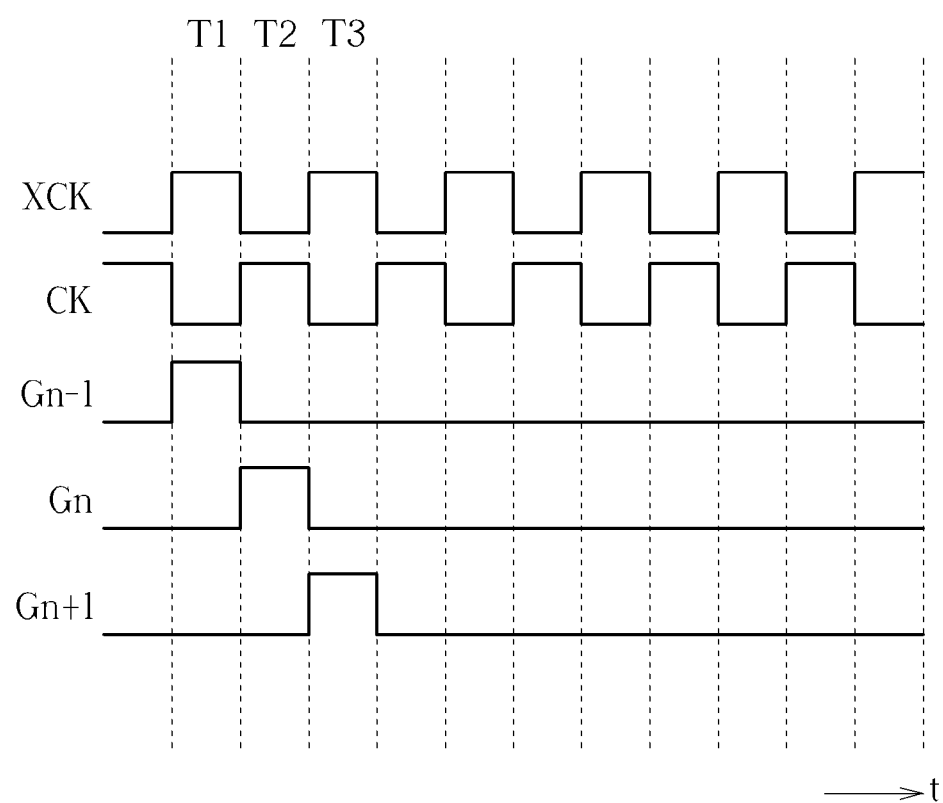
FIG. 2 is a timing diagram illustrating the gate driving circuit of FIG. 1.
Figure 3:
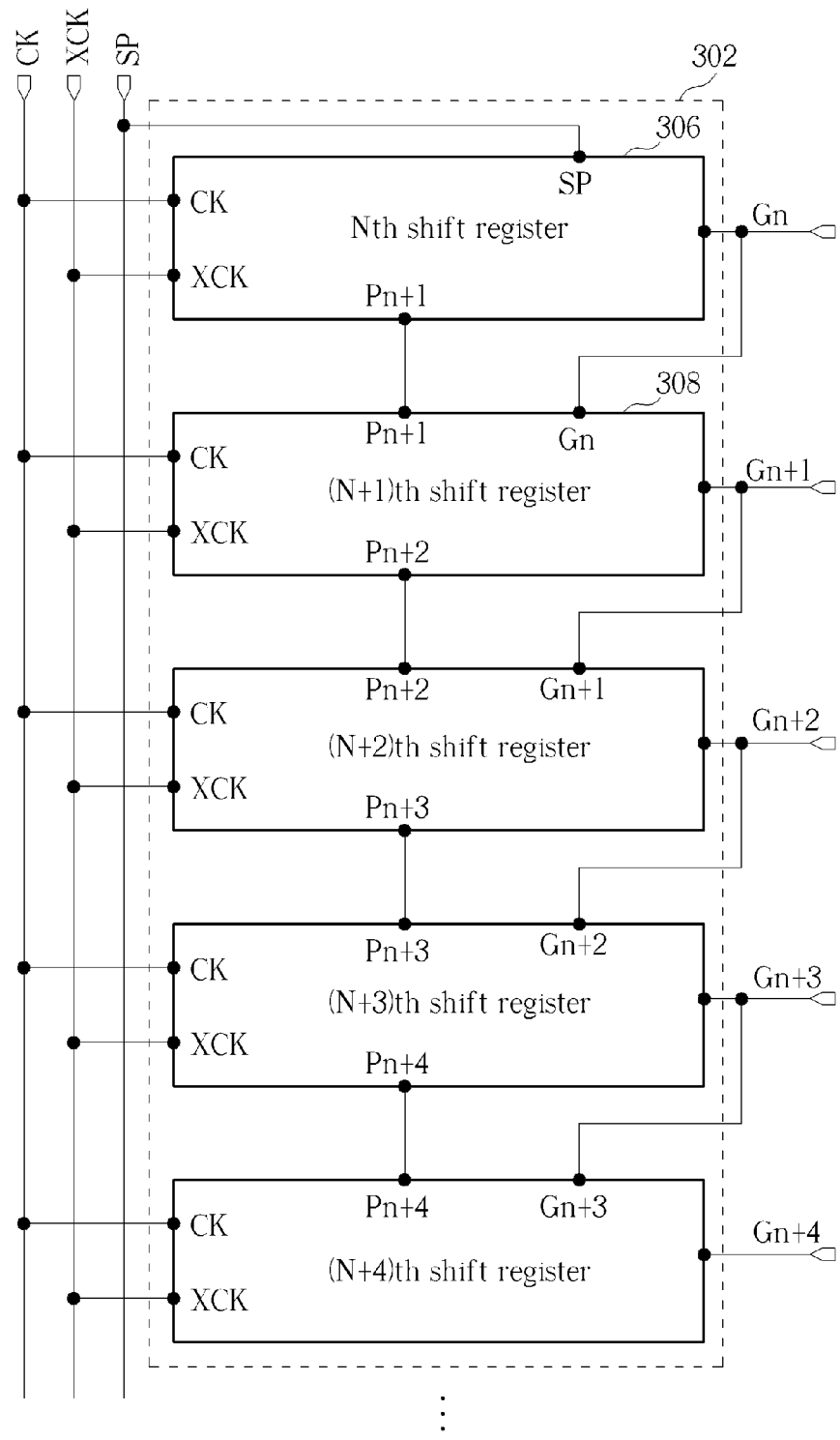
FIG. 3 is a diagram illustrating a gate driving circuit according to an embodiment of the present invention.
Figure 4:
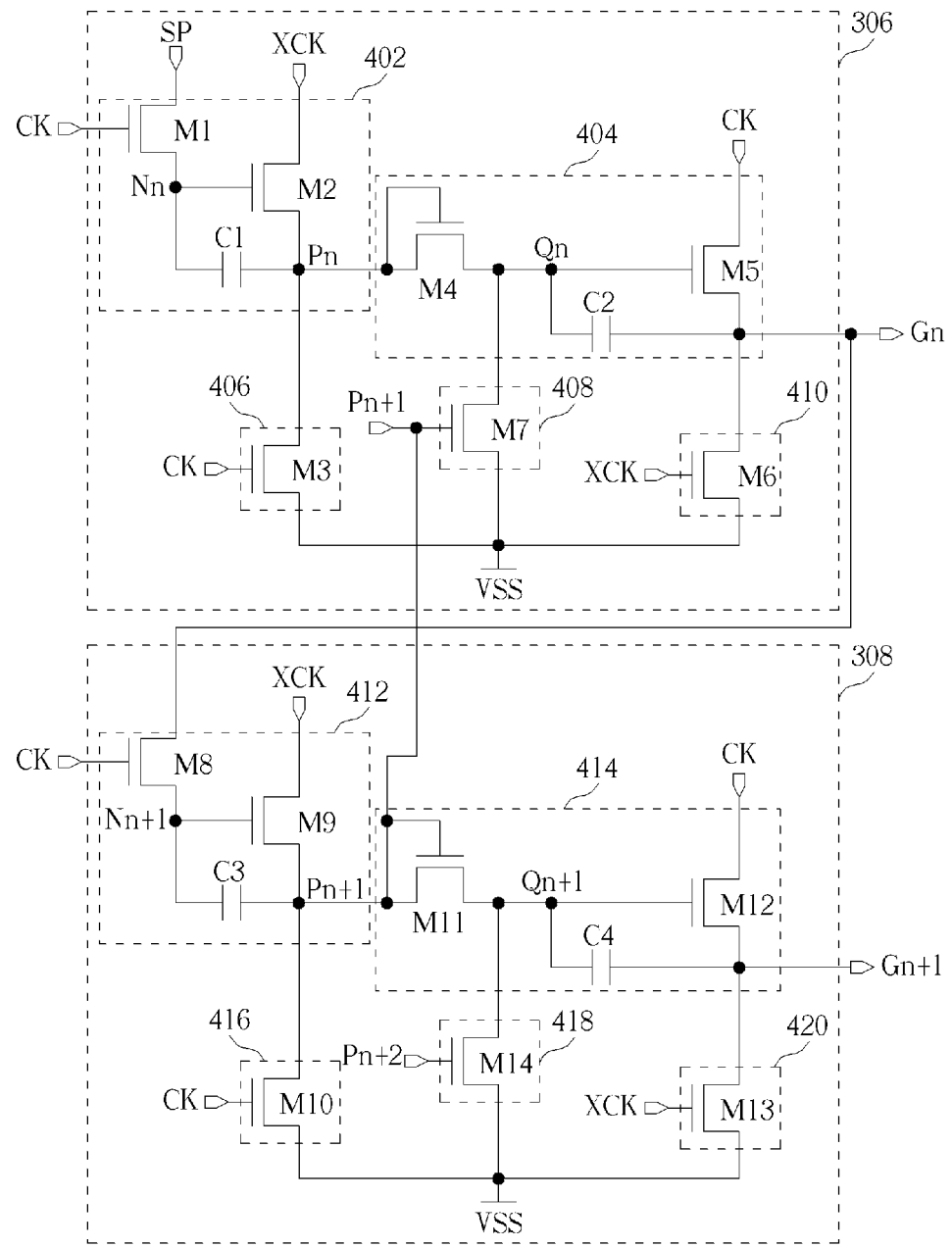
FIG. 4 is a diagram illustrating shift registers of FIG. 3 according to an embodiment of the present invention.

FIG. 3 is a diagram illustrating a gate driving circuit 302 according to an embodiment of the present invention. The gate driving circuit 302 may include a plurality of shift registers. FIG. 4 is a diagram illustrating shift registers of FIG. 3 according to an embodiment of the present invention. For brevity, an Nth shift register 306 and an (N+1)th shift register 308 of FIG. 3 are taken as example in FIG. 4. All transistors in FIG. 4 may be N-type thin film transistor (TFT).

The Nth shift register 306 may include a pull up unit 402, a driving unit 404, a first pull down unit 406, a second pull down unit 408, and a third pull down unit 410. The pull up unit 402 is used for providing a first pull up signal Pn according to a first clock signal CK, a second clock signal XCK, and a starting pulse SP. The starting pulse SP may be an (N−1)th shift register's gate signal or may be provided by a display panel system. The first pull up signal Pn may be the Nth shift register 306's pull up signal. The driving unit 404 is used for providing a first driving signal Qn according to the first pull up signal Pn and for providing a first gate signal Gn according to the first clock signal CK and the first driving signal Qn. The first driving signal Qn may be the Nth shift register 306's driving signal. The first gate signal Gn may be the Nth shift register 306's gate signal. The first pull down unit 406 is used for pulling down the first pull up signal Pn according to the first clock signal CK. The second pull down unit 408 is used for pulling down the first driving signal Qn according to a second pull up signal Pn+1. The second pull up signal Pn+1 may be the (N+1)th shift register 308's pull up signal. The third pull down unit 410 is used for pulling down the first gate signal Gn according to the second clock signal XCK. The first clock signal CK and the second clock signal XCK may be out of phase.

The pull up unit 402 of the Nth shift register 306 may include a first transistor M1, a second transistor M2, and a first capacitor C1. The first pull down unit 406 may include a third transistor M3. The driving unit 404 may include a fourth transistor M4, a fifth transistor M5, and a second capacitor C2. The third pull down unit 410 may include a sixth transistor M6. The second pull down unit 408 may include a seventh transistor M7.

The first transistor M1 has a control end for receiving the first clock signal CK, a first end for receiving the starting pulse SP, and a second end. The second transistor M2 has a control end coupled to the second end of the first transistor M1, a first end for receiving the second clock signal XCK, and a second end for providing the first pull up signal Pn. The third transistor M3 has a control end for receiving the first clock signal CK, a first end coupled to the second end of the second transistor M2, and a second end for receiving a low voltage VSS. The fourth transistor M4 has a control end coupled to the second end of the second transistor M2, a first end coupled to the control end of the fourth transistor M4, and a second end for providing the first driving signal Qn. The fifth transistor M5 has a control end coupled to the second end of the fourth transistor M4, a first end for receiving the first clock signal CK, and a second end for providing the first gate signal Gn. The sixth transistor M6 has a control end for receiving the second clock signal XCK, a first end coupled to the second end of the fifth transistor M5, and a second end coupled to the second end of the third transistor M3. The seventh transistor M7 has a control end for receiving the second pull up signal Pn+1, a first end coupled to the control end of the fifth transistor M5, and a second end coupled to the second end of the third transistor M3. The first capacitor C1 is coupled between the second end of the first transistor M1 and the second end of the second transistor M2. The second capacitor C2 is coupled between the control end of the fifth transistor M5 and the second end of the fifth transistor M5.

The (N+1)th shift register 308 may include a pull up unit 412, a driving unit 414, a first pull down unit 416, a second pull down unit 418, and a third pull down unit 420. The pull up unit 412 is used for providing the second pull up signal Pn+1 according to the first clock signal CK, the second clock signal XCK, and the first gate signal Gn. The driving unit 414 is used for providing a second driving signal Qn+1 according to the second pull up signal Pn+1 and for providing a second gate signal Gn+1 according to the first clock signal CK and the second driving signal Qn+1. The second driving signal Qn+1 may be the (N+1) th shift register 308' s driving signal . The second gate signal Gn+1 may be the (N+1) th shift register 308's gate signal. The first pull down unit 416 is used for pulling down the second pull up signal Pn+1 according to the first clock signal CK. The second pull down unit 418 is used for pulling down the second driving signal Qn+1 according to a third pull up signal Pn+2. The third pull up signal Pn+2 may be an (N+2) th shift register's pull up signal. The third pull down unit 420 is used for pulling down the second gate signal Gn+1 according to the second clock signal XCK.

The pull up unit 412 of the (N+1) th shift register 308 may include an eighth transistor M8, a ninth transistor M9, and a third capacitor C3. The first pull down unit 416 may include a tenth transistor M10. The driving unit 414 may include an eleventh transistor M11, a twelfth transistor M12, and a fourth capacitor C4. The third pull down unit 420 may include a thirteenth transistor M13. The second pull down unit 418 may include a fourteenth transistor M14.

The eighth transistor M8 has a control end for receiving the first clock signal CK, a first end for receiving the first gate signal Gn, and a second end. The ninth transistor M9 has a control end coupled to the second end of the eighth transistor M8, a first end for receiving the second clock signal XCK, and a second end for providing the second pull up signal Pn+1. The tenth transistor M10 has a control end for receiving the first clock signal CK, a first end coupled to the second end of the ninth transistor M9, and a second end for receiving the low voltage VSS. The eleventh transistor M11 has a control end coupled to the second end of the ninth transistor M9, a first end coupled to the control end of the eleventh transistor M11, and a second end for providing the second driving signal Qn+1. The twelfth transistor M12 has a control end coupled to the second end of the eleventh transistor M11, a first end for receiving the first clock signal CK, and a second end for providing the second gate signal Gn+1. The thirteenth transistor M13 has a control end for receiving the second clock signal XCK, a first end coupled to the second end of the twelfth transistor M12, and a second end coupled to the second end of the tenth transistor M10. The fourteenth transistor M14 has a control end for receiving the third pull up signal Pn+2, a first end coupled to the control end of the twelfth transistor M12, and a second end coupled to the second end of the tenth transistor M10. The third capacitor C3 is coupled between the second end of the eighth transistor M8 and the second end of the ninth transistor M9. The fourth capacitor C4 is coupled between the control end of the twelfth transistor M12 and the second end of the twelfth transistor M12.

Figure 5:
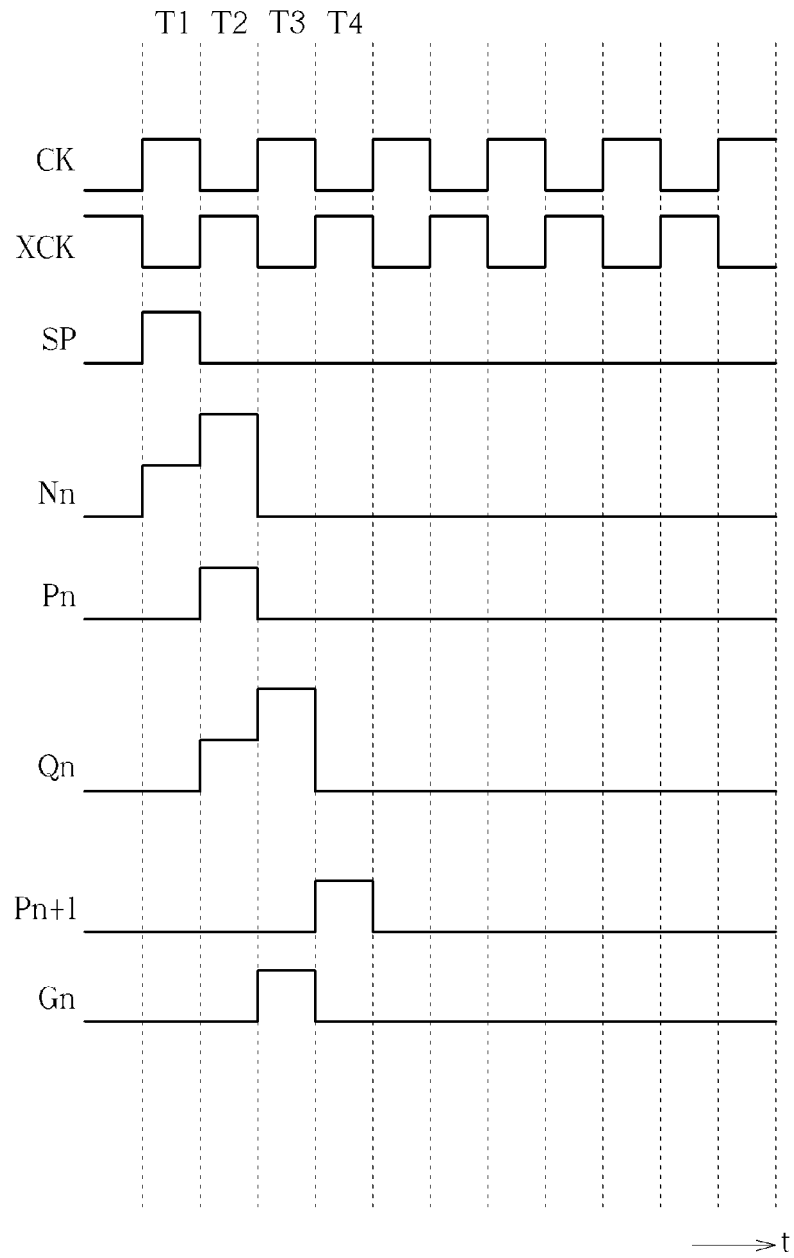
FIG. 5 is a timing diagram illustrating operations of shift registers of FIG. 4 according to an embodiment of the present invention.

FIG. 5 is a timing diagram illustrating operations of shift registers of FIG. 4 according to an embodiment of the present invention. In FIG. 5, the horizontal axis is time t, and from top to bottom are the first clock signal CK, the second clock signal XCK, the starting pulse SP, a node Nn's signal, the first pull up signal Pn, the first driving signal Qn, the second pull up signal Pn+1, and the first gate signal Gn. Operations of the Nth shift register 306 are described below. During the T1 period, the starting pulse SP and the first clock signal CK switch from a low voltage to a high voltage for conducting the first transistor M1 and furnishing the high voltage of the starting pulse SP to the node Nn of the first capacitor C1. During the T2 period, the first clock signal CK switches from the high voltage to the low voltage and the second clock signal XCK switches from the low voltage to the high voltage, and the node Nn rises to a voltage higher than the high voltage because of the capacitive coupling effect of the first capacitor C1, thereby conducting the second transistor M2 and pulling up the first pull up signal Pn to the high voltage of the second clock signal XCK. Then the fourth transistor M4 conducts and the first driving signal Qn is pulled up to the high voltage of the first pull up signal Pn. During the T3 period, the first clock CK switches from the low voltage to the high voltage and the second clock signal XCK switches from the high voltage to the low voltage for conducting the third transistor M3 and pulling down the first pull up signal Pn to the low voltage, which further cuts off the fourth transistor M4. Then the first driving signal Qn rises to a voltage higher than the high voltage because of the capacitive coupling effect of the second capacitor C2, thereby conducting the fifth transistor M5 and pulling up the first gate signal Gn to the high voltage of the first clock signal CK. Then the first gate signal Gn is outputted to the (N+1)th shift register 308 to be a starting pulse of the (N+1)th shift register 308. During T4 period, the second clock signal XCK switches from the low voltage to the high voltage for conducting the sixth transistor M6 and pulling down the first gate signal Gn. As illustrated in FIG. 5, the first pull up signal Pn's waveform is the starting pulse SP's waveform being shifted once and the first gate signal Gn's waveform is the starting pulse SP's waveform being shifted twice. During T4 period, the second pull up signal Pn+1 of the (N+1)th shift register 308 may be fed back to the Nth shift register 306 for conducting the seventh transistor M7 and pulling down the first driving signal Qn. The (N+1)th shift register 308 works in an analogous manner as the Nth shift register 306.

As shown in FIG. 5, the first gate signal Gn's waveform of the Nth shift register 306 of FIG. 4 is the starting pulse SP's waveform being shifted twice, namely, the first gate signal Gn's waveform is a waveform of the (N−1)th shift register's gate signal being shifted twice. Similarly, the second gate signal Gn+1's waveform of the (N+1)th shift register 308 is the first gate signal Gn's waveform of the Nth shift register 306 being shifted twice. In other words, the gate signal of each stage of shift register is separated from that of a preceding stage next to the stage of shift register by half period of the first clock signal CK.

Figure 6:
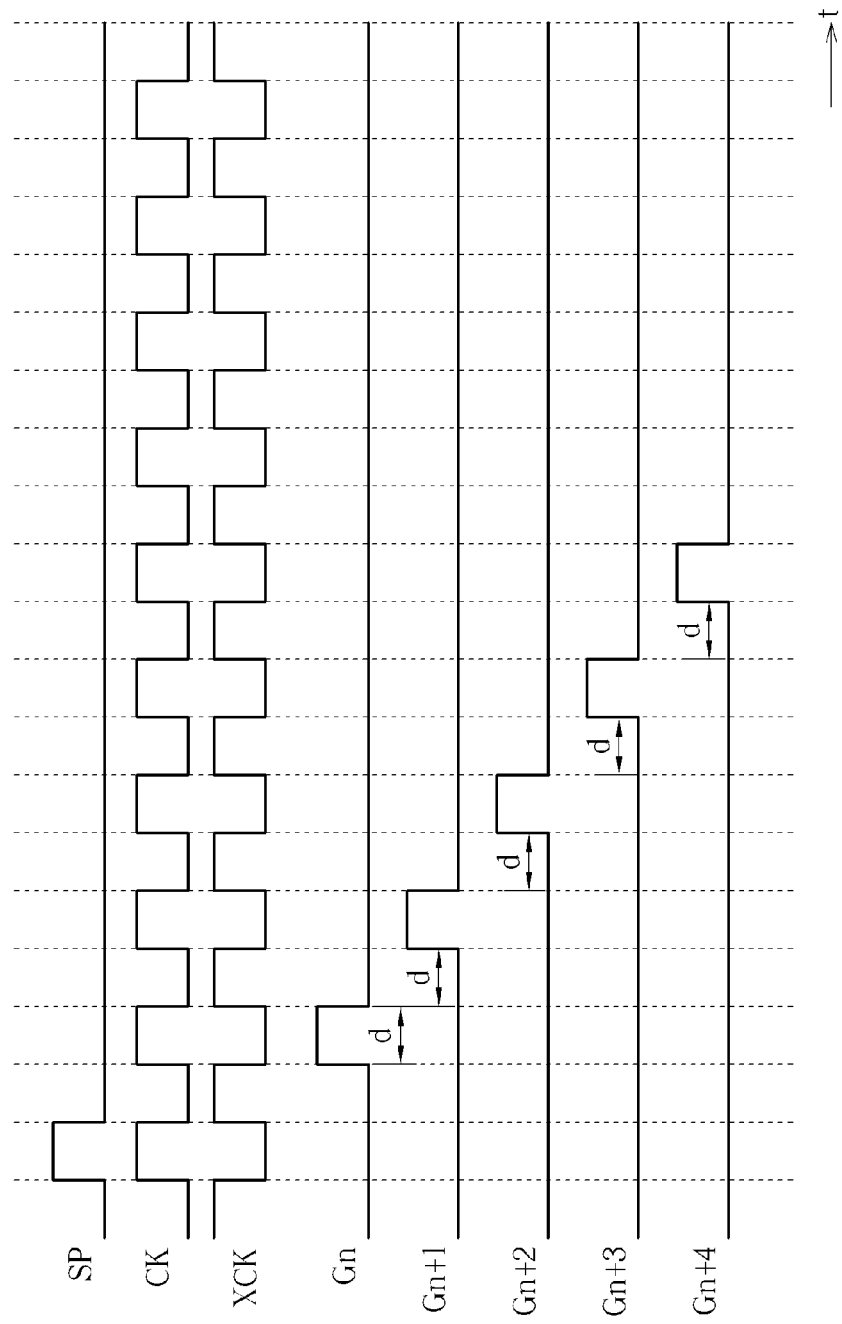
FIG. 6 is a timing diagram illustrating the gate driving circuit of FIG. 3 according to an embodiment of the present invention.

FIG. 6 is a timing diagram illustrating the gate driving circuit 302 of FIG. 3 according to an embodiment of the present invention.

In FIG. 6, the horizontal axis is time t, and from top to bottom are the starting pulse SP, the first clock signal CK, the second clock signal XCK, the Nth gate signal Gn, the (N+1)th gate signal Gn+1, an (N+2)th gate signal Gn+2, an (N+3)th gate signal Gn+3, and an (N+4)th gate signal Gn+4. As illustrated set forth in FIG. 5, the Nth gate signal Gn's waveform of the gate driving circuit 302 is the starting pulse SP's waveform being shifted twice, the (N+1)th gate signal Gn+1's waveform is the Nth gate signal Gn's waveform being shifted twice, the (N+2)th gate signal Gn+2's waveform is the (N+1)th gate signal Gn+1's waveform being shifted twice, the (N+3)th gate signal Gn+3's waveform is the (N+2)th gate signal Gn+2's waveform being shifted twice, and the (N+4)th gate signal Gn+4's waveform is the (N+3)th gate signal Gn+3's waveform being shifted twice.

Figure 7:
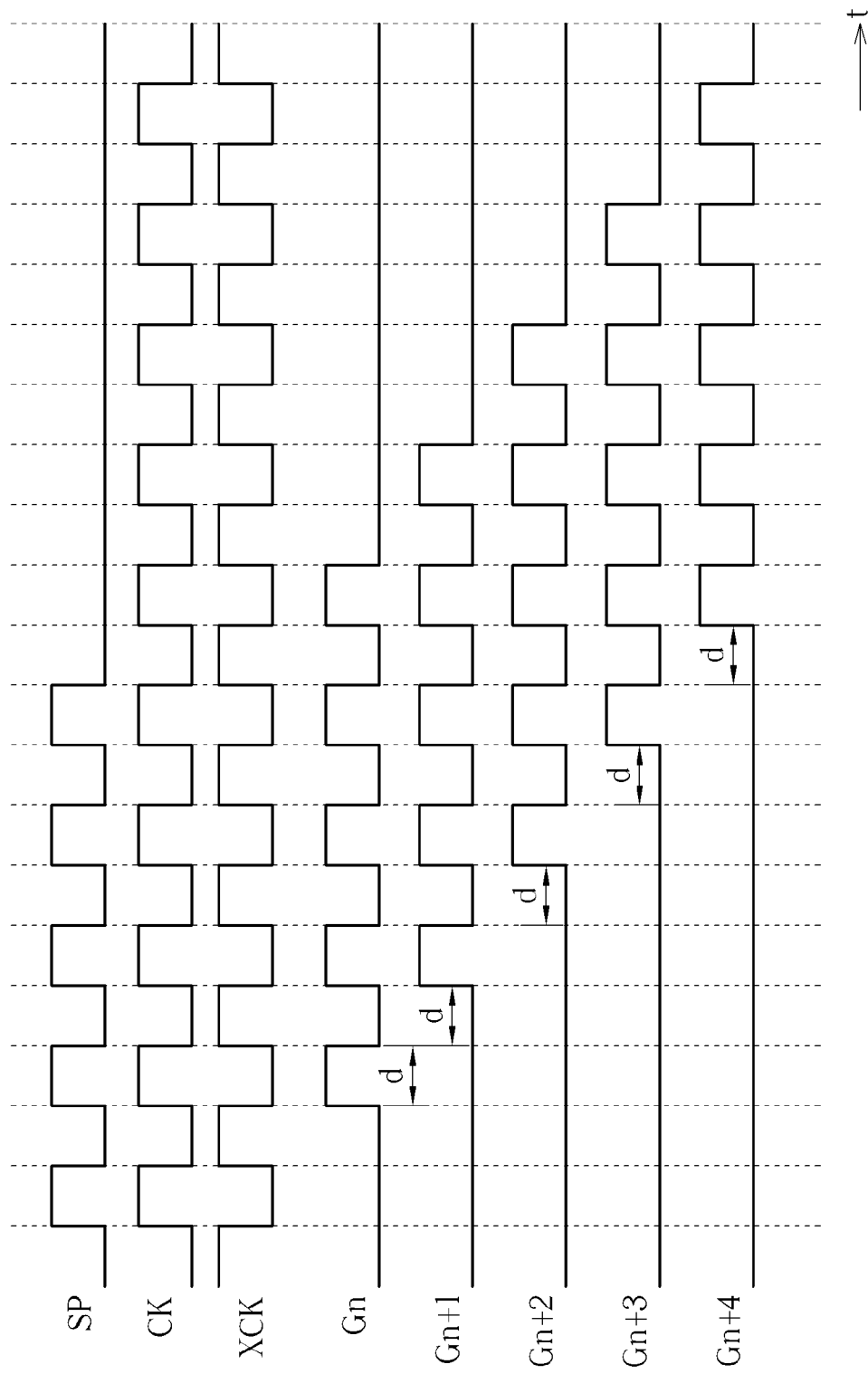
FIG. 7 is a timing diagram illustrating the gate driving circuit of FIG. 3 according to another embodiment of the present invention.

FIG. 7 is a timing diagram illustrating the gate driving circuit 302 of FIG. 3 according to another embodiment of the present invention. In FIG. 7, the horizontal axis is time t, and from top to bottom are the starting pulse SP, the first clock signal CK, the second clock signal XCK, the Nth gate signal Gn, the (N+1)th gate signal Gn+1, the (N+2)th gate signal Gn+2, the (N+3)th gate signal Gn+3, and the (N+4)th gate signal Gn+4. The difference between FIG. 7 and FIG. 6 is that the starting pulse SP in FIG. 7 contains multiple pulses, thus the Nth gate signal Gn, the (N+1)th gate signal Gn+1, the (N+2)th gate signal Gn+2, the (N+3)th gate signal Gn+3, and the (N+4)th gate signal Gn+4 all contain multiple pulses. Each pulse of the Nth gate signal Gn's waveform is each pulse of the starting pulse SP's waveform being shifted twice, each pulse of the (N+1)th gate signal Gn+1's waveform is each pulse of the Nth gate signal Gn's waveform being shifted twice, each pulse of the (N+2)th gate signal Gn+2's waveform is each pulse of the (N+1)th gate signal Gn+1's waveform being shifted twice, each pulse of the (N+3)th gate signal Gn+3's waveform is each pulse of the (N+2)th gate signal Gn+2's waveform being shifted twice, and each pulse of the (N+4)th gate signal Gn+4's waveform is each pulse of the (N+3)th gate signal Gn+3's waveform being shifted twice.

Figure 8:
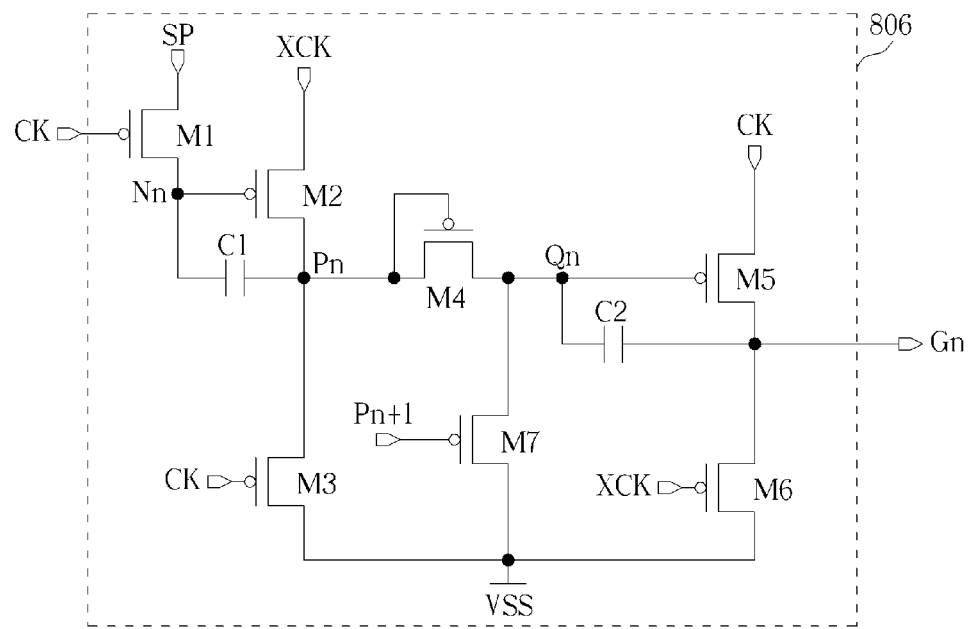
FIG. 8 is a diagram illustrating an Nth shift register according to another embodiment of the present invention.

FIG. 8 is a diagram illustrating an Nth shift register 806 according to another embodiment of the present invention. The circuit structure of the Nth shift register 806 is similar to that of the Nth shift register 306 of FIG. 4, the differences being that all transistors in FIG. 8 may be P-type TFT and the low voltage VSS in FIG. 4 is replaced by a high voltage VDD in FIG. 8.

Figure 9:
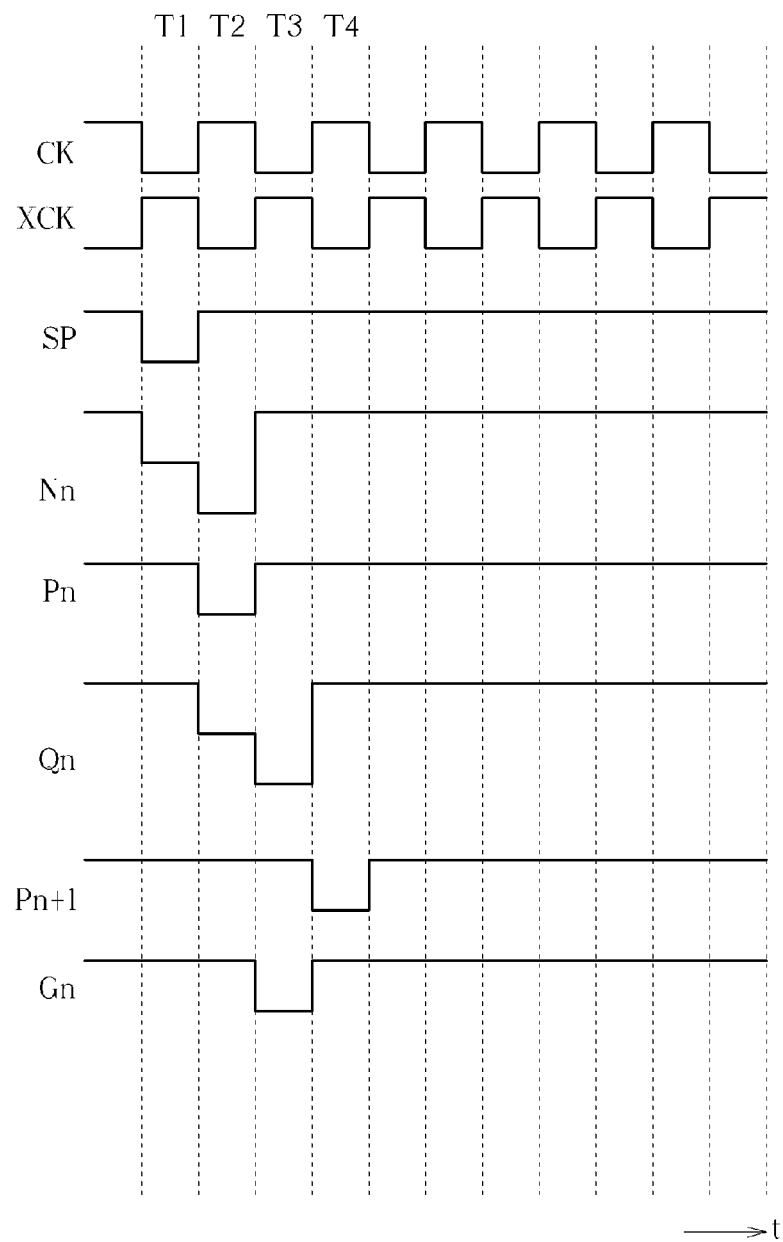
FIG. 9 is a timing diagram illustrating operations of the Nth shift register of FIG. 8 according to an embodiment of the present invention.

FIG. 9 is a timing diagram illustrating operations of the Nth shift register 806 of FIG. 8 according to an embodiment of the present invention. In FIG. 9, the horizontal axis is time t, and from top to bottom are the first clock signal CK, the second clock signal XCK, the starting pulse SP, the node Nn's signal, the first pull up signal Pn, the first driving signal Qn, the second pull up signal Pn+1, and the first gate signal Gn. Operations of the Nth shift register 806 are described below. During the T1 period, the starting pulse SP and the first clock signal CK switches from a high voltage to a low voltage for conducting the first transistor M1 and furnishing the low voltage of the starting pulse SP to the node Nn of the first capacitor C1. During the T2 period, the first clock signal CK switches from the low voltage to the high voltage and the second clock signal XCK switches from the high voltage to the low voltage, and the node Nn falls to a voltage lower than the low voltage because of the capacitive coupling effect of the first capacitor C1, thereby conducting the second transistor M2 and pulling down the first pull up signal Pn to the low voltage of the second clock signal XCK. Then the fourth transistor M4 conducts because the fourth transistor M4 is diode-connected and the first driving signal Qn is pulled down to the low voltage of the first pull up signal Pn. During the T3 period, the first clock CK switches from the high voltage to the low voltage and the second clock signal XCK switches from the low voltage to the high voltage for conducting the third transistor M3 and pulling up the first pull up signal Pn to the high voltage, which further cuts off the fourth transistor M4. Then the first driving signal Qn falls to a voltage lower than the low voltage because of the capacitive coupling effect of the second capacitor C2, thereby conducting the fifth transistor M5 and pulling down the first gate signal Gn to the low voltage of the first clock signal CK. During the T4 period, the second clock signal XCK switches from the high voltage to the low voltage for conducting the sixth transistor M6 and pulling up the first gate signal Gn. In FIG. 9, the first pull up signal Pn's waveform is the starting pulse SP's waveform being shifted once and the first gate signal Gn's waveform is the starting pulse SP's waveform being shifted twice. During the T4 period, the second pull up signal Pn+1 of the (N+1)th shift register may be fed back to the Nth shift register 806 for conducting the seventh transistor M7 and pulling up the first driving signal Qn. Thus the second pull up signal Pn+1 needs not be provided by signals outside the gate driving circuit, which greatly simplifies the design thereof. Other stages of shift registers works in an analogous manner as the Nth shift register 806.

In summary, embodiments of the invention disclose the gate driving circuit includes a plurality of shift registers where the gate signal of each stage of shift register is that of a preceding stage next to the stage of shift register being shifted twice. Thus there is no need to lay out each stage of shift register twice and components and layout area of the shift registers may be reduced. Further, circuit nodes of the shift registers next to each other in the gate driving circuit for receiving the second clock signal XCK and the first clock signal CK need not to be arranged in alternating fashion, which simplifies the routing design of clock signals.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A shift register comprising:
   a pull up unit for providing a first pull up signal according to a first clock signal, a second clock signal, and a starting pulse;
   a third transistor having a control end for receiving the first clock signal, a first end coupled to the pull up unit, and a second end for receiving a low voltage;
   a fifth transistor having a first end for receiving the first clock signal, and a second end for providing a gate signal;
   a sixth transistor having a control end for receiving the second clock signal, a first end coupled to the second end of the fifth transistor, and a second end coupled to the second end of the third transistor; and
   a seventh transistor having a control end for receiving a second pull up signal, a first end coupled to a control end of the fifth transistor, and a second end coupled to the second end of the third transistor, and a fourth transistor having a control end coupled to the pull up unit, a first end coupled to the control end of the fourth transistor, and a second end coupled to the control end of the fifth transistor for providing a driving signal.

2. The shift register of claim 1, wherein the pull up unit comprises:
   a first transistor having a control end for receiving the first clock signal, a first end for receiving the starting pulse, and a second end; and
   a second transistor having a control end coupled to the second end of the first transistor, a first end for receiving the second clock signal, and a second end for providing the first pull up signal.

3. The shift register of claim 2 further comprising:
   a first capacitor coupled between the second end of the first transistor and the second end of the second transistor.

4. The shift register of claim 1 further comprising:
   a second capacitor coupled between the control end of the fifth transistor and the second end of the fifth transistor.

5. The shift register of claim 1, wherein the first clock signal and the second clock signal are out of phase relative to each other.

6. A gate driving circuit comprising:
   an Nth shift register comprising:
      a first pull up unit for providing a first pull up signal according to a first clock signal, a second clock signal, and a starting pulse;
      a third transistor having a control end for receiving the first clock signal, a first end coupled to the first pull up unit, and a second end for receiving a low voltage;
      a fifth transistor having a first end for receiving the first clock signal, and a second end for providing a first gate signal;
      a sixth transistor having a control end for receiving the second clock signal, a first end coupled to the second end of the fifth transistor, and a second end coupled to the second end of the third transistor; and
      a seventh transistor having a control end for receiving a second pull up signal, a first end coupled to a control end of the fifth transistor, and a second end coupled to the second end of the third transistor; and
   an (N+1)th shift register comprising:
      a second pull up unit for providing the second pull up signal according to the first clock signal, the second clock signal, and the first gate signal;
      a tenth transistor having a control end for receiving the first clock signal, a first end coupled to the second pull up unit, and a second end for receiving the low voltage;
      a twelfth transistor having a first end for receiving the first clock signal, and a second end for providing a second gate signal;
      a thirteenth transistor having a control end for receiving the second clock signal, a first end coupled to the second end of the twelfth transistor, and a second end coupled to the second end of the tenth transistor; and
      a fourteenth transistor having a control end for receiving a third pull up signal, a first end coupled to a control end of the twelfth transistor, and a second end coupled to the second end of the tenth transistor wherein the Nth shift register further comprises a fourth transistor having a control end coupled to the first pull up unit, a first end coupled to the control end of the fourth transistor, and a second end coupled to the control of the fifth transistor for providing a first driving signal; and wherein the (N+1)th shift register further comprises an eleventh transistor having a control end coupled to the second pull up unit, a first end coupled to the control end of the eleventh transistor, and a second end coupled to the control end of the twelfth transistor for providing a second driving signal.

7. The gate driving circuit of claim 6, wherein the first pull up unit comprises:
   a first transistor having a control end for receiving the first clock signal, a first end for receiving the starting pulse, and a second end; and
   a second transistor having a control end coupled to the second end of the first transistor, a first end for receiving the second clock signal, and a second end for providing the first pull up signal; and
   wherein the second pull up unit comprises:
      an eighth transistor having a control end for receiving the first clock signal, a first end for receiving the first gate signal, and a second end; and
      a ninth transistor having a control end coupled to the second end of the eighth transistor, a first end for receiving the second clock signal, and a second end for providing the second pull up signal.

8. The gate driving circuit of claim 7, wherein the Nth shift register further comprises:
   a first capacitor coupled between the second end of the first transistor and the second end of the second transistor; and
   a second capacitor coupled between the control end of the fifth transistor and the second end of the fifth transistor.

9. The gate driving circuit of claim 7, wherein the (N+1)th shift register further comprises:
   a third capacitor coupled between the second end of the eighth transistor and the second end of the ninth transistor; and
   a fourth capacitor coupled between the control end of the twelfth transistor and the second end of the twelfth transistor.

10. The gate driving circuit of claim 6, wherein the first clock signal and the second clock signal are out of phase relative to each other.

11. A shift register comprising:
- a pull up unit for providing a first pull up signal according to a first clock signal, a second clock signal, and a starting pulse;
- a driving unit for providing a driving signal according to the first pull up signal and for providing a gate signal according to the first clock signal and the driving signal;
- a first pull down unit for pulling down the first pull up signal according to the first clock signal;
- a second pull down unit for pulling down the driving signal according to a second pull up signal; and
- a third pull down unit for pulling down the gate signal according to the second clock signal.

12. The shift register of claim 11, wherein the pull up unit comprises:
- a first transistor having a control end for receiving the first clock signal, a first end for receiving the starting pulse, and a second end;
- a second transistor having a control end coupled to the second end of the first transistor, a first end for receiving the second clock signal, and a second end for providing the first pull up signal; and
- a first capacitor coupled between the second end of the first transistor and the second end of the second transistor.

13. The shift register of claim 11, wherein the first pull down unit comprises:
- a third transistor having a control end for receiving the first clock signal, a first end coupled to the pull up unit, and a second end for receiving a low voltage.

14. The shift register of claim 11, wherein the driving unit comprises:
- a fourth transistor having a control end coupled to the pull up unit, a first end coupled to the control end of the fourth transistor, and a second end for providing the driving signal;
- a fifth transistor having a control end coupled to the second end of the fourth transistor, a first end for receiving the first clock signal, and a second end for providing a gate signal; and
- a second capacitor coupled between the control end of the fifth transistor and the second end of the fifth transistor.

15. The shift register of claim 11, wherein the third pull down unit comprises:
- a sixth transistor having a control end for receiving the second clock signal, a first end coupled to the driving unit, and a second end for receiving a low voltage.

16. The shift register of claim 11, wherein the second pull down unit comprises:
- a seventh transistor having a control end for receiving the second pull up signal, a first end coupled to the driving unit, and a second end for receiving a low voltage.

17. The shift register of claim 11, wherein the first clock signal and the second clock signal are out of phase relative to each other.

* * * * *